United States Patent
Wang et al.

(10) Patent No.: US 7,495,490 B2
(45) Date of Patent: Feb. 24, 2009

(54) DIGITAL AMPLIFIER AND METHOD THEREOF

(75) Inventors: Tze-Chien Wang, Taipei (TW); Wen-Chi Wang, Yun-Lin Hsien (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 36 days.

(21) Appl. No.: 11/674,153

(22) Filed: Feb. 13, 2007

(65) Prior Publication Data

US 2007/0194972 A1 Aug. 23, 2007

(30) Foreign Application Priority Data

Feb. 20, 2006 (TW) .............................. 95105630 A

(51) Int. Cl.
*H03K 3/017* (2006.01)
(52) U.S. Cl. .................... 327/172; 327/176; 327/24
(58) Field of Classification Search ............ 327/14–16, 327/24–26, 34, 36, 172–176
See application file for complete search history.

(56) References Cited

U.S. PATENT DOCUMENTS

| | | | |
|---|---|---|---|
| 4,059,807 A | 11/1977 | Hamada | |
| 4,141,033 A * | 2/1979 | de Boer | ........................ 386/28 |
| 5,077,539 A | 12/1991 | Howatt | |
| 5,430,406 A * | 7/1995 | Kolodziejczyk | ............. 327/336 |
| 5,451,893 A | 9/1995 | Anderson | |
| 5,506,532 A | 4/1996 | Milazzo | |
| 5,798,730 A * | 8/1998 | Sanchez | ..................... 342/195 |
| 5,907,254 A | 5/1999 | Chang | |
| 6,140,875 A | 10/2000 | Van Den Homberg et al. | |
| 6,211,728 B1 | 4/2001 | Chen et al. | |
| 6,262,632 B1 | 7/2001 | Corsi et al. | |
| 6,300,825 B1 | 10/2001 | Dijkmans et al. | |
| 6,339,553 B1 * | 1/2002 | Kuge | .......................... 365/194 |
| 6,348,836 B2 | 2/2002 | Delano | |
| 6,768,779 B1 | 7/2004 | Nielsen | |
| 6,924,757 B2 | 8/2005 | Adams et al. | |
| 6,943,717 B1 | 9/2005 | Forejt | |
| 6,998,894 B2 | 2/2006 | Lee | |

OTHER PUBLICATIONS

Karten Nielsen, "2.3 Analog Pulse Width Modulation", Chapter 2 Analog Pulse Modulation, Audio Power Amplifier Techniques With Energy Efficient Power COnversion, p. 18-24.
Steen M. Munk, et al., "State of the Art Digital Pulse Modulated Amplifier System", AES 23th International Conference, Copenhagen, Denmark, May 23-25, 2003, pp. 1-18.
Guang-Kaai Dehng, et al., "Clock-Deskew Buffer Using a SAR-Controlled Delay-Locked Loop", IEEE Journal of Solid-State Circuits, Aug. 2000, pp. 1128-1136, vol. 35, No. 8.

* cited by examiner

*Primary Examiner*—An T Luu
(74) *Attorney, Agent, or Firm*—Winston Hsu

(57) ABSTRACT

An apparatus includes a first trigger, a second trigger, a pulse generator, and a control unit. The first trigger generates a first trigger signal and a first level signal; the second trigger generates a second trigger signal and a second level signal; the pulse generator generates a digital output signal according to the first and the second level signals; and the control unit outputs the first and the second control voltages according to the digital input signal and the digital output signal.

20 Claims, 7 Drawing Sheets

DIGITAL AMPLIFIER AND METHOD THEREOF

BACKGROUND OF THE INVENTION

1. Field of the Invention

The present invention relates to a digital amplifier, and more particularly, a digital amplifier that has improved power efficiency.

2. Description of the Prior Art

Applications needing high power efficiency usually use a pulse-width-modulation (PWM) signal to drive a class D power amplifier (also known as a digital amplifier) in a following stage. The advantage of such a system is low power dissipation, but the PWM signal is easily interfered with by several non-ideal factors such as power noise. As a result, the PWM signal is distorted.

U.S. Pat. No. 6,768,779 provides a digital amplifier to solve the abovementioned problem; however, the error-correction range of the digital amplifier relates to a delay time. If the delay time is short, the PWM signal cannot be compensated effectively; if the delay time is long, the output signal will be an error. For IC technology, the delay time varies greatly according to the IC fabrication and the operation temperature.

SUMMARY OF THE INVENTION

It is therefore one of the objectives of the claimed invention to provide a digital amplifier for eliminating the distortion caused by time delay or/and power noise, to solve the abovementioned problems.

According to the claimed invention, an apparatus includes a first trigger for generating a first trigger signal according to a digital input signal, and for generating a first level signal according to the first trigger signal and a first control voltage; a second trigger for generating a second trigger signal according to the digital input signal, and for generating a second level signal according to the second trigger signal and a second control voltage; a pulse generator for generating a digital output signal according to the first and the second level signals; and a control unit for outputting the first and the second control voltages according to the digital output signal.

According to the claimed invention, a method of processing a digital input signal includes generating a first trigger signal according to the digital input signal; generating a first level signal according to the first trigger signal and a first control voltage; generating a second trigger signal according to of the digital input signal; generating a second level signal according to the second trigger signal and a second control voltage; and generating a digital output signal according to the first and the second level signals.

These and other objectives of the present invention will no doubt become obvious to those of ordinary skill in the art after reading the following detailed description of the preferred embodiment that is illustrated in the various figures and drawings.

DETAILED DESCRIPTION

The digital amplifier disclosed in the present invention modifies a digital input signal to a digital output signal such that the digital output signal is capable of effectively driving a class D power amplifier in a following stage. In a general case, the digital input signal is a PWM signal, and the digital output signal is a modified pulse-width-modulation (MPWM) signal.

Figure 1:
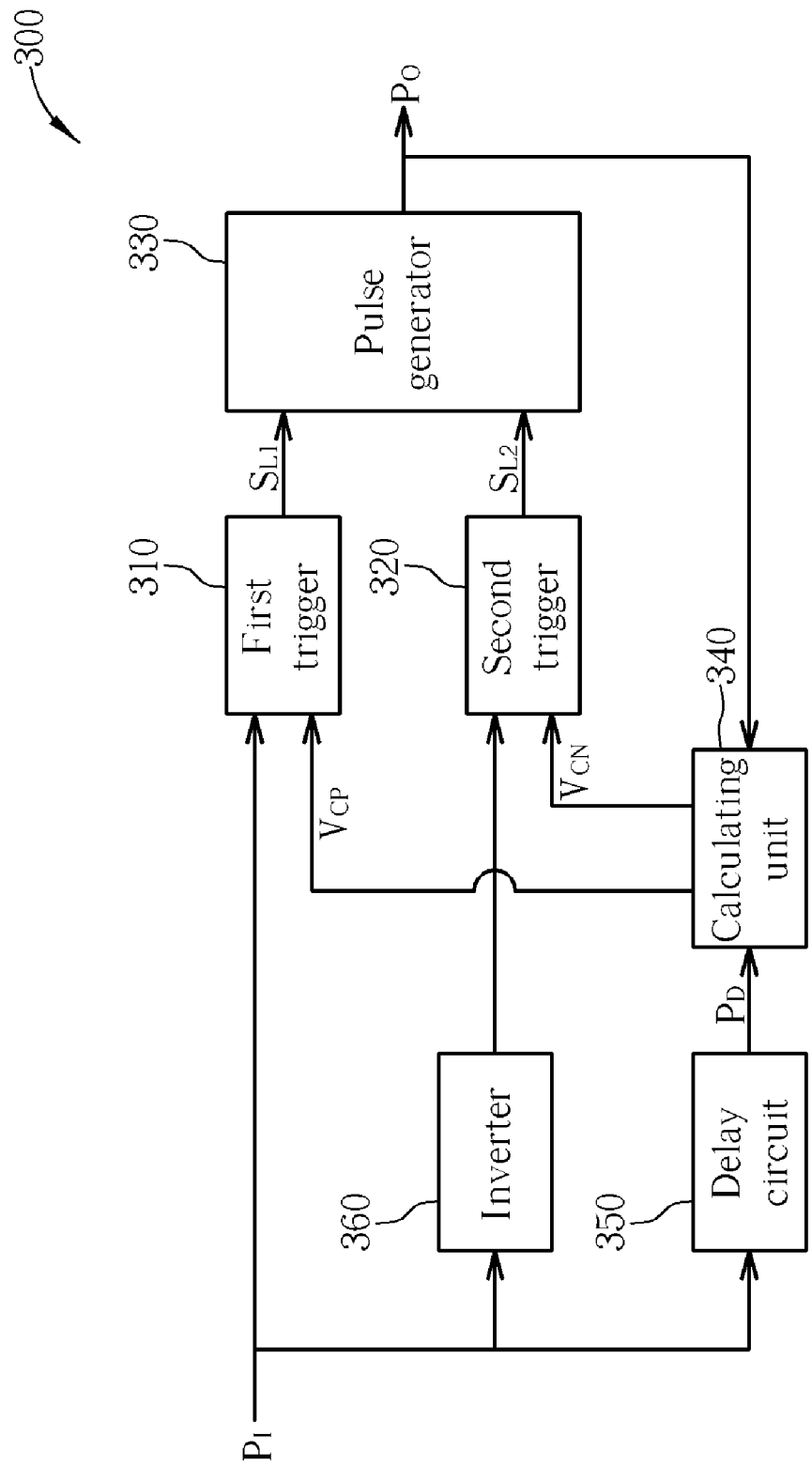
FIG. 1 is a block diagram of the digital amplifier according to a preferred embodiment of the present invention.
Figure 2:
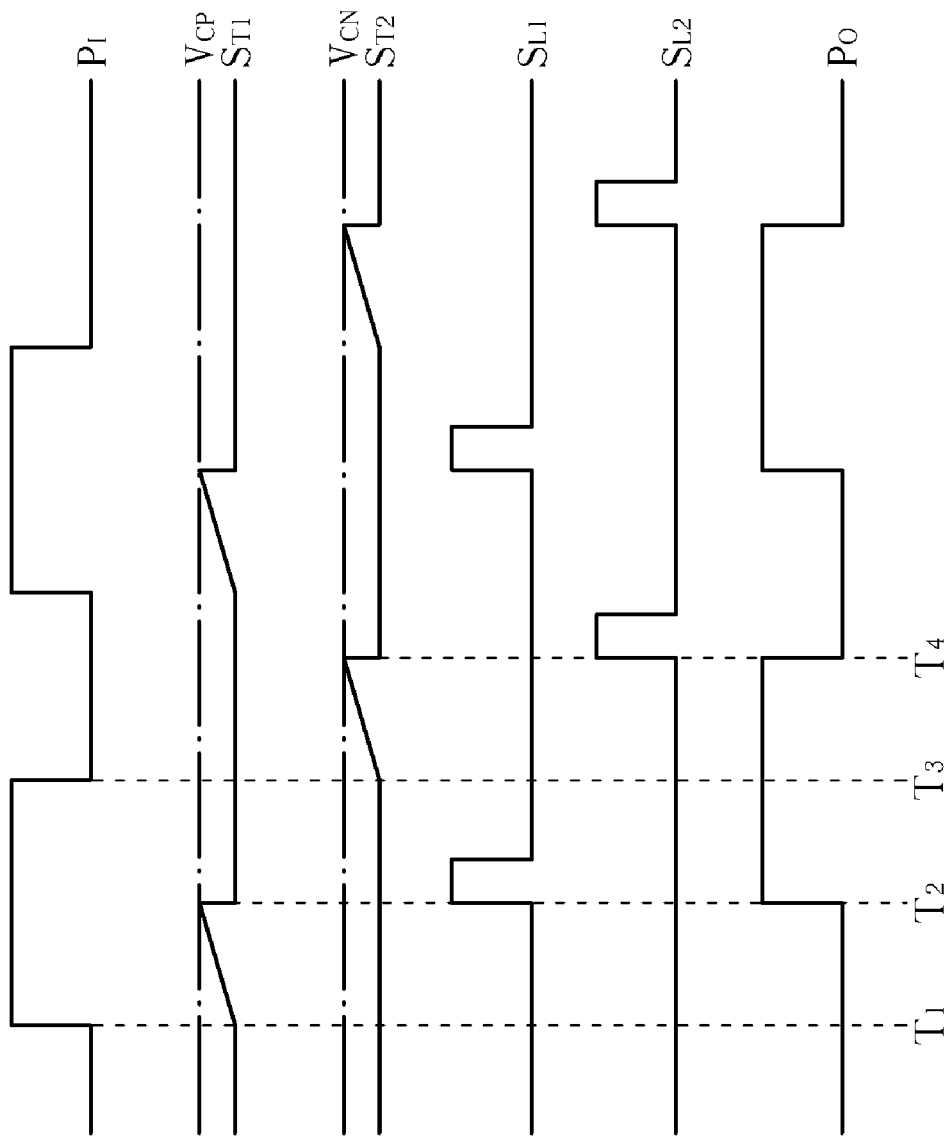
FIG. 2 is a waveform diagram of signals $P_I$, $S_{T1}$, $V_{CP}$, $S_{T2}$, $V_{CN}$, $S_{L1}$, $S_{L2}$ and $P_O$ related to the digital amplifier illustrated in FIG. 1.

FIG. 1 is a block diagram of the digital amplifier 300 according to a preferred embodiment of the present invention, and FIG. 2 is a waveform diagram of signals $P_I$, $S_{T1}$, $V_{CP}$, $S_{T2}$, $V_{CN}$, $S_{L1}$, $S_{L2}$ and $P_O$ related to the digital amplifier 300 illustrated in FIG. 1. The digital amplifier includes a first trigger 310, a second trigger 320, a pulse generator 330, a calculating unit 340, a delay circuit 350 and an inverter 360. The inverter 360 is in front of the second trigger 320, therefore, the trigger position of the first trigger 310 is the rising edge of the PWM signal $P_I$, and the second trigger 320 is the falling edge of the PWM signal $P_I$. As shown in FIG. 2, the first trigger 310 generates a first trigger signal while the PWM signal $P_I$ is at the rising edge (i.e. $T_1$). In the embodiment, the voltage of a first triangle wave $S_{T1}$ rises with a fixed slope, and then the first trigger 310 compares the voltage of the first triangle wave $S_{T1}$ with the first control voltage $V_{CP}$. When voltage of the first triangle wave $S_{T1}$ reaches the first control voltage $V_{CP}$ (i.e. $T_2$), the first trigger 310 outputs a first level signal $S_{L1}$ and resets voltage of the first triangle wave $S_{T1}$ to an initial voltage. The pulse generator 330 changes the voltage of the MPWM signal $P_O$ while the first level signal $S_{L1}$ is received. As shown in FIG. 2, the voltage of the MPWM signal $P_O$ is changed from an original low voltage level to a high voltage level at $T_2$. The second trigger 320 generates a second trigger signal while the PWM signal $P_I$ is at the falling edge trigger (i.e. $T_3$). In the embodiment, the voltage of a second triangle wave $S_{T2}$ rises with the same fixed slope, and then the second trigger 320 compares the voltage of the second triangle wave $S_{T2}$ with the second control voltage $V_{CN}$. When voltage of the second triangle wave $S_{T2}$ reaches the second control voltage $V_{CN}$ (i.e. $T_4$), the second trigger 320 outputs a second level signal $S_{L2}$ and resets voltage of the second triangle wave $S_{T2}$ to an initial voltage. The pulse generator 330 restores the voltage of the MPWM signal $P_O$ while the second level signal $S_{L2}$ is received. As shown in FIG. 2, the voltage of the MPWM signal $P_O$ is changed from an original high voltage level to a low voltage level at $T_4$.

Obviously, values of the first control voltage $V_{CP}$ and the second control voltage $V_{CN}$ determine width of the MPWM signal $P_O$ and the MPWM signal $P_O$ lags behind the PWM signal $P_I$ by a delay time. In fact, the first control voltage $V_{CP}$ and the second control voltage $V_{CN}$ have to modify pulse width of the PWM signal $P_I$ for matching exact power, and the delay time between every pulse of the MPWM signal $P_O$ and the corresponding pulse of the PWM signal $P_I$ should be the same, such that no distortion occurs. Please refer to FIG. 1 again. The delay circuit 350 delays the PWM signal $P_I$ by a delay time to generate a delayed pulse-width-modulation (DPWM) signal $P_D$, and as a result, the DPWM signal $P_D$ is synchronous with the MPWM signal $P_O$. Next, the calculating unit 340 calculates the first control voltage $V_{CP}$ and the second control voltage $V_{CN}$ utilizing the following relationship:

$$\begin{cases} V_{CP} + V_{CN} = V_{REF} \\ L[V_{CP} - C_{CN}] = H(S)L[P_D - P_O] \end{cases}$$

wherein $V_{CP}$ and $V_{CN}$ are the first and the second control voltages; $V_{REF}$ is a predetermined constant set by users; $P_D$ is the DPWM signal; $P_O$ is the MPWM signal; H(S) is a response function of the calculating unit 340; and the operator L[ ] is a Laplace transform.

Because the digital amplifier 300 of the present invention utilizes different triggers to generate the level signals $S_{L1}$ and $S_{L2}$ according to the rising edge and the falling edge of the inputted PWM signal $P_I$, errors that occur in the prior art will not occur in the present invention when the width of the PWM signal $P_I$ is too short. Similarly, when the distance between two pulses in the PWM signal $P_I$ is too short, a significant error will not be induced.

Figure 3:
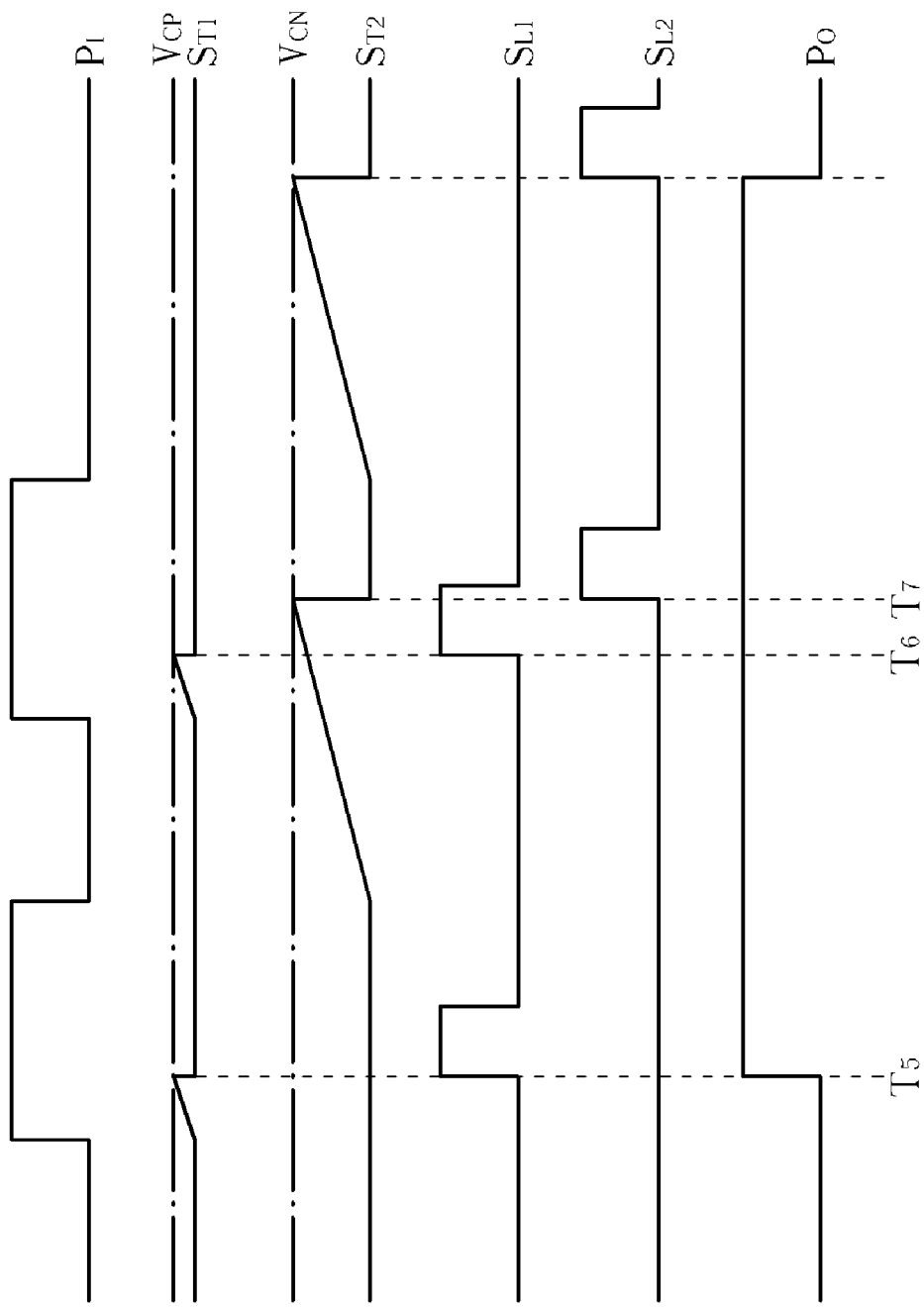
FIG. 3 is a waveform diagram of related signals $P_I$, $S_{T1}$, $V_{CP}$, $S_{T2}$, $V_{CN}$, $S_{L1}$, $S_{L2}$ and $P_O$ when the system power is low.
Figure 4:
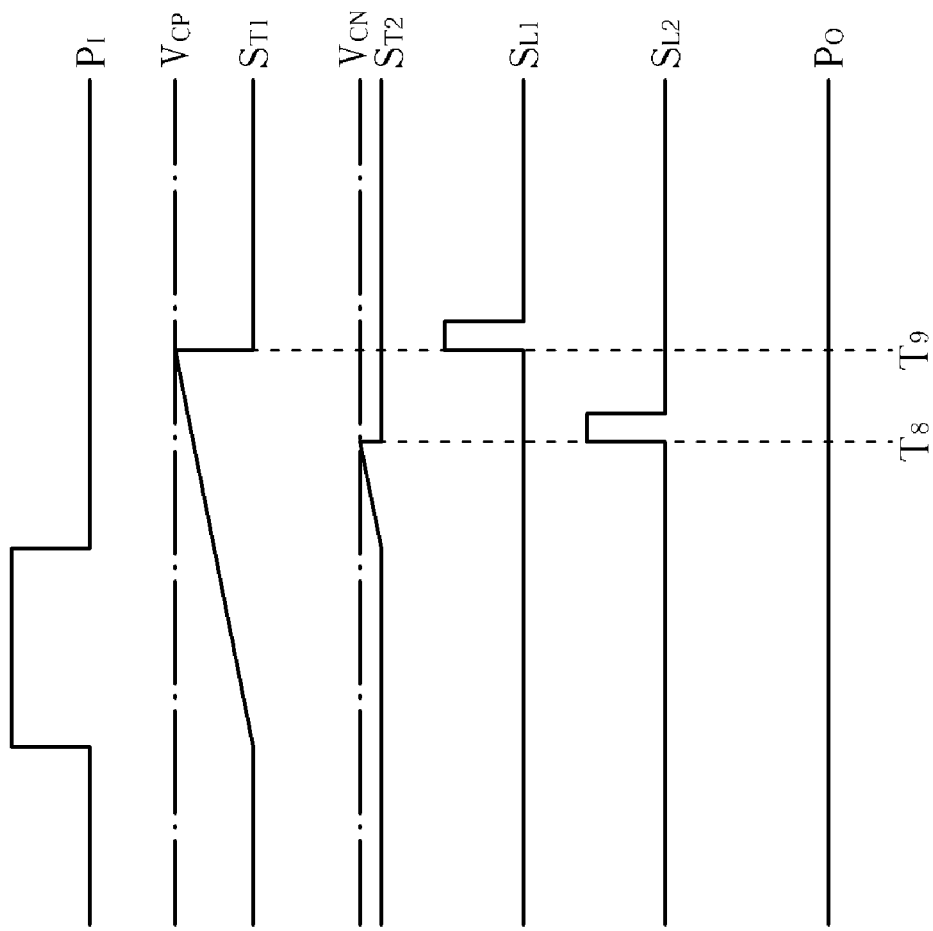
FIG. 4 is a waveform diagram of related signals $P_I$, $S_{T1}$, $V_{CP}$, $S_{T2}$, $V_{CN}$, $S_{L1}$, $S_{L2}$ and $P_O$ when the system power is high.

Furthermore, when the power noise is serious, the digital amplifier 300 of the present invention can overcome the influence of the power noise. Please refer to FIG. 3. FIG. 3 is a waveform diagram of related signals $P_I$, $S_{ST1}$, $V_{CP}$, $S_{T2}$, $V_{CN}$, $S_{L1}$, $S_{L2}$ and $P_O$ when the system power is low. Due to low system power causing the pulse efficiency to be insufficient, the first control voltage $V_{CP}$ is small and the second control voltage $V_{CN}$ is large. The first triangle wave $S_{T1}$ reaches the first control voltage $V_{CP}$ at time $T_5$ and generates the first level signal $S_{L1}$. Before the second triangle wave $S_{T2}$ reaches the second control voltage $V_{CN}$ at time $T_7$ and generates the second level signal $S_{L2}$, the first triangle wave $S_{T1}$ reaches the first control voltage $V_{CP}$ at time $T_6$ and generates another pulse at the first level signal $S_{L1}$. That is, the pulse generator 330 continuously receives two pulses of the first level signal $S_{L1}$. The pulse generator 330 changes the voltage of the MPWM signal $P_O$ when the pulse of the initial first level signal is received, and ignores the next second level signal $S_{L2}$ until it receives the second pulse of the second level signal $S_{L2}$, and restores the voltage of the MPWM signal $P_O$ to an initial voltage value. Therefore, the MPWM signal $P_O$ keeps a high voltage level for a period to amplify output power in order to compensate for the influence of the low system power. Please refer to FIG. 4. FIG. 4 is a waveform diagram of related signals $P_I$, $S_{T1}$, $V_{CP}$, $S_{T2}$, $V_{CN}$, $S_{L1}$, $S_{L2}$ and $P_O$ when the system power is high. Due to high system power causing the pulse efficiency to be too large, the first control voltage $V_{CP}$ is large and the second control voltage $V_{CN}$ is small. Before the first triangle wave $S_{T1}$ reaches the first control voltage $V_{CP}$ at time $T_9$ and generates the first level signal $S_{L1}$, the second triangle wave $S_{T2}$ reaches the second control voltage $V_{CN}$ at time $T_8$ and generates the second level signal $S_{L2}$. The pulse generator 330 ignores the received pulse of the first level signal $S_{L1}$, and makes sure that the MPWM signal $P_O$ is kept at a low voltage level to reduce output power for compensating for the influence of the large system power. Consequently, if the pulse generator 330 continuously receives N pulses of the first level signal $S_{L1}$, the pulse generator 330 changes the voltage of the MPWM signal $P_O$ while an initial pulse of the N pulses of the first level signal $S_{L1}$ is received, ignores next (N−1) pulses of the second level signal $S_{L2}$ until receiving an Nth pulse of the second level signal $S_{L2}$, and then restores the voltage of the MPWM signal $P_O$ to an initial voltage value.

Please note that slopes of the first and the second triangle waves can be adjusted by the designers themselves according to operative conditions. Basically, setting a small slope (that is, voltage rises up slowly) guarantees that the digital amplifier 300 has a sufficient time margin under fabrication difference and temperature variation to keep maximum modification range.

Figure 5:
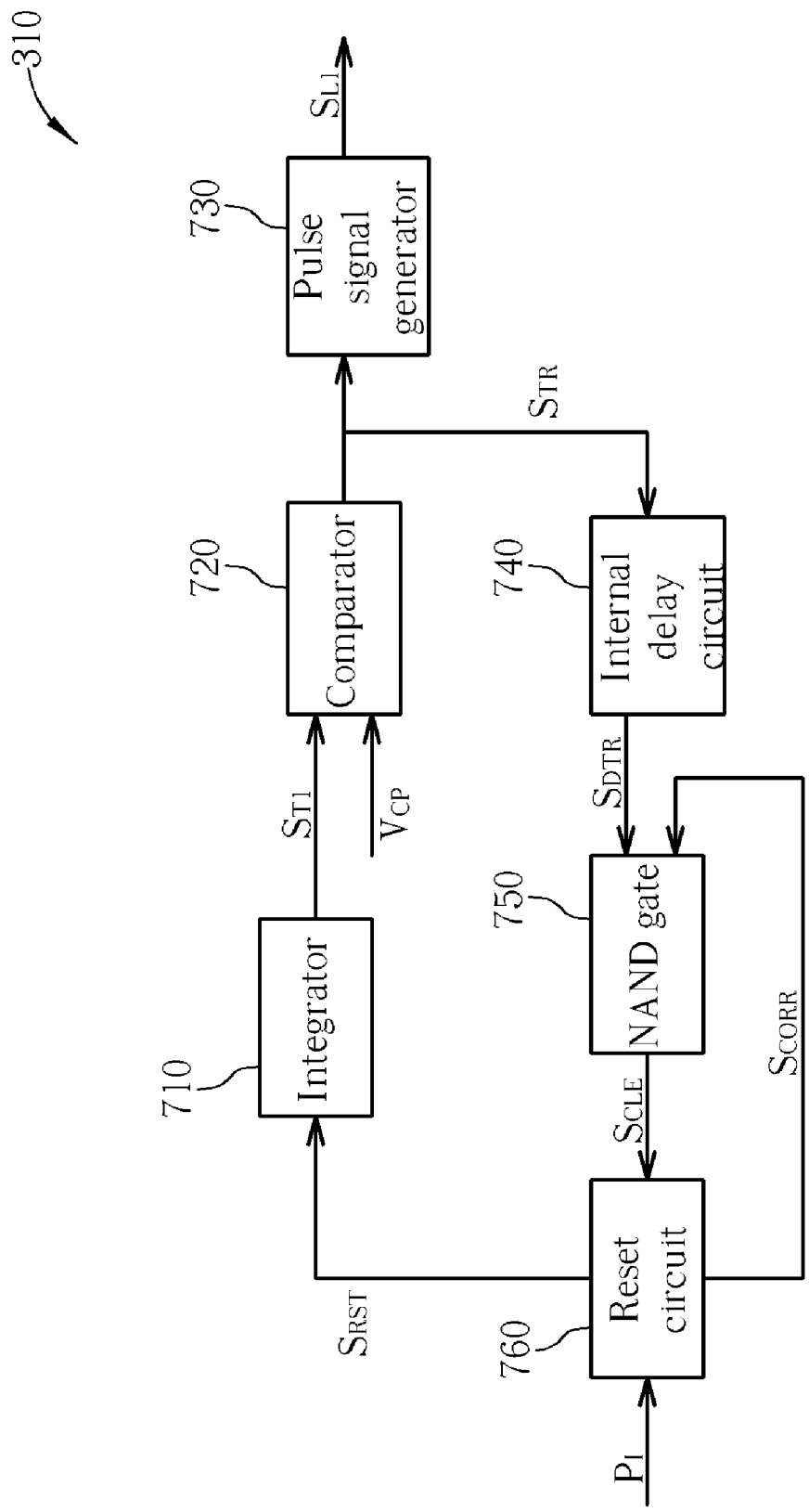
FIG. 5 is a block diagram of the first trigger according to a preferred embodiment of the present invention.

FIG. 5 is a block diagram of the first trigger 310 according to a preferred embodiment of the present invention. Please note that the second trigger 320 is similar to the first trigger 310 in the electric structure. The first trigger 310 includes an integrator 710, a comparator 720, a pulse signal generator 730, an internal delay circuit 740, a NAND gate 750, and a reset circuit 760. When the rising edge of the PWM signal $P_I$ is triggered, the integrator 710 starts to integrate to generate the first triangle wave $S_{T1}$; and when the integrator 710 receives a reset signal $S_{RST}$, the integrator 710 is reset (i.e. the first triangle wave $S_{T1}$ is reset to be the initial voltage). The comparator 720 compares the first triangle wave $S_{T1}$ with the first control voltage to generate a comparison signal $S_{TR}$, after receiving the comparison signal $S_{TR}$, the pulse signal generator 730 generates a wider pulse than the original pulse to be the first level signal $S_{L1}$ such that circuits in the next stage classify pulses distinctly. Additionally, the comparison signal $S_{TR}$ is delayed by the internal delay circuit 740 to generate a delayed comparison signal $S_{DTR}$. The delayed comparison signal $S_{DTR}$ and a correction signal $S_{CORR}$ are next inputted into the NAND gate 750 to generate a clear signal $S_{CLE}$. Finally, the reset circuit 760 generates a reset signal $S_{RST}$ in accordance with the PWM signal $P_I$ and the clear signal $S_{CLE}$ to control the integrator 760. Taking the embodiment illustrated in FIG. 3 for example, when the rising edge of the PWM signal $P_I$ is triggered, the reset signal $S_{RST}$ controls the integrator 710 to integrate. If the voltage of the first triangle wave $S_{T1}$ reaches the first control voltage $V_{CP}$, the comparison signal $S_{TR}$ and the delayed comparison signal $S_{DTR}$ are changed, making sure that the voltage of the clear signal $S_{CLE}$ is also changed. After detecting variation of the voltage of the clear signal $S_{CLE}$, the reset circuit 760 generates the reset signal $S_{RST}$ to reset the integrator 710 such that the first trigger works normally while the next rising edge trigger of the PWM signal $P_I$ occurs.

Please note that the objective of the internal delay circuit 740 and the NAND gate 750 illustrated in FIG. 5 is to increase operation stability of the first trigger 310, and the objective of the pulse signal generator 730 is to make the first level signal $S_{L1}$ more distinct to be identified by a next stage circuit. Therefore, it is possible to neglect the delay circuit 740, the NAND gate 750, and the pulse signal generator 730 for actual application. Meanwhile, the integrator 710 and the comparator 720 can be accomplished by operational amplifiers, and the reset circuit 760 can be accomplished by D-type flip-flops.

Figure 6:
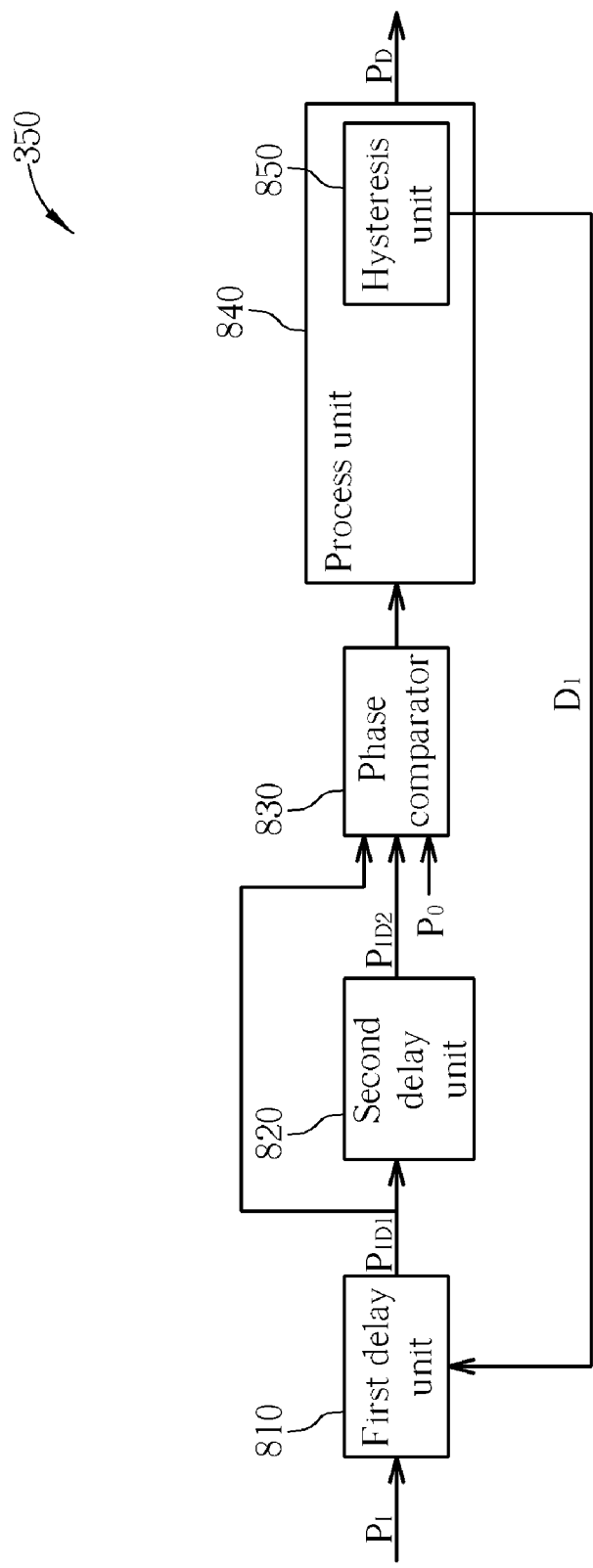
FIG. 6 is a block diagram of the delay circuit according to a preferred embodiment of the present invention.
Figure 7:
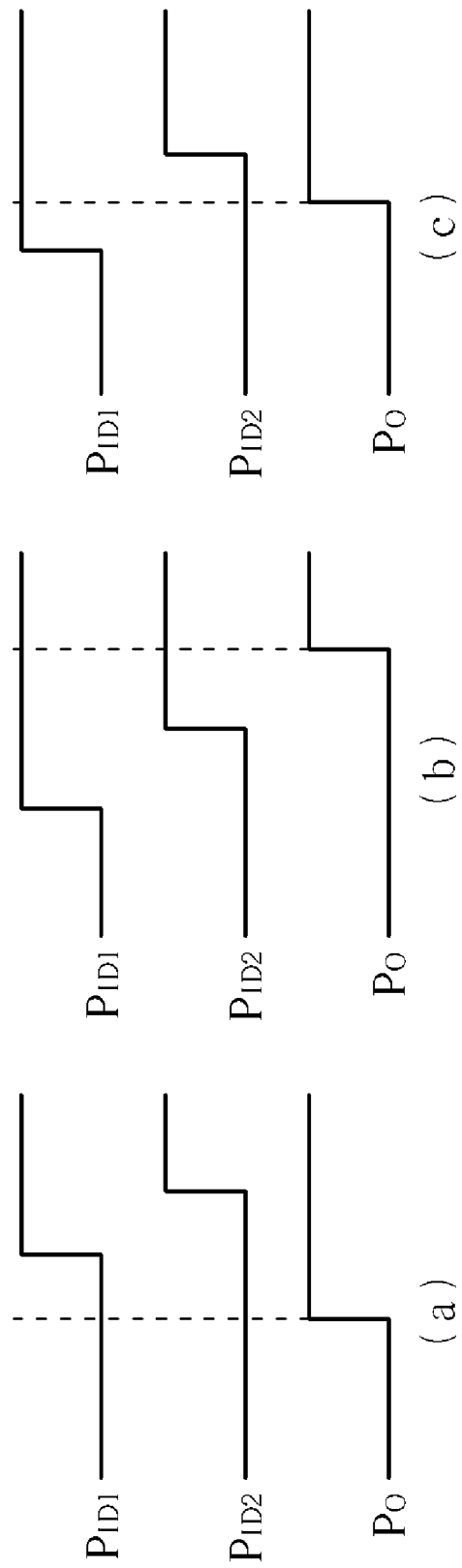
FIG. 7 is a diagram showing the phase relationship between the first delayed signal $P_{ID1}$, the second delayed signal $P_{ID2}$, and the MPWM signal $P_O$ as compared by the phase comparator illustrated in FIG. 6.

FIG. 6 is a block diagram of a preferred embodiment of the delay circuit 350 according to the present invention. The delay circuit 350 includes a first delay unit 810, a second delay unit 820, a phase comparator 830, and a process unit 840. At first, the first delay unit 810 delays the PWM signal $P_I$ a first lag time to generate a first delayed signal $P_{ID1}$, and the second delay unit 820 delays the first delayed signal $P_{ID1}$ a second lag time to generate a second delayed signal $P_{ID2}$. Secondly, the phase comparator 830 compares phase relationship of the first delayed signal $P_{ID1}$, the second delayed signal $P_{ID2}$, and the MPWM signal $P_O$. Please refer to FIG. 7, FIG. 7 is a diagram showing the phase relationship between the first delayed signal $P_{ID1}$, the second delayed signal $P_{ID2}$, and the MPWM signal $P_O$ compared by the phase comparator 830 illustrated in FIG. 6. If both phases of the first delayed signal $P_{ID1}$ and the second delayed signal $P_{ID2}$ fall behind the MPWM signal $P_O$ (as shown in FIG. 7(a)), that is, the first lag time is too long, the process unit 840 generates an adjustment signal $D_1$ to shorten the first lag time (i.e. decrease the lag time caused by the first delay unit 810); if both phases of the first delayed signal $P_{ID1}$ and the second delayed signal $P_{ID2}$ are ahead of the MPWM signal $P_O$ (as shown in FIG. 7(b)), that is, the second lag time is too long, the process unit 840 generates an adjustment signal $D_1$ to increase the second lag time (i.e. increase the lag time caused by the first delay unit 810). In other words, the process unit 840 generates the adjustment signal $D_1$ in accordance with the phase relationship of the first delayed signal $P_{ID1}$, the second delayed signal $P_{ID2}$, and the MPWM signal $P_O$ to control the first delay unit 810, such that the phase of the MPWM signal $P_O$ is positioned between the first delayed signal $P_{ID1}$ and the second delayed signal $P_{ID2}$ (as shown in FIG. 7(c)). Therefore, either the first delayed signal $P_{ID1}$ or the second delayed signal $P_{ID2}$ can be the output signal of the delay circuit 350, i.e. the DPWM signal $P_D$.

The process unit 840 includes a hysteresis unit 850, wherein the hysteresis unit 850 refers to phase information to generate an adjustment signal $D_1$ that does not vary frequently with time. Consequently, the variation frequency of the adjustment signal $D_1$ is lower than the variation frequency of the output signal of the phase comparator 830. Besides increasing stability of the system, the inclusion of the hysteresis unit 850 also avoids a frequency range that human ears can hear, thereby reducing noise. Please note the hysteresis unit 850 is merely one embodiment of the present invention and is not a necessary component.

Please note that, for different conditions, users can determine the lag time of the second delay unit 820 shown in FIG. 6. Furthermore, for simplicity, a fixed lag time of the second delay unit 820 is also permitted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for processing a digital input signal to generate a digital output signal, comprising:
    a first trigger, for generating a first trigger signal according to a rising edge of the digital input signal and generating a first level signal according to the first trigger signal and a first control voltage;
    a second trigger, for generating a second trigger signal according to a falling edge of the digital input signal and generating a second level signal according to the second trigger signal and a second control voltage;
    a pulse generator coupled to the first and the second trigger, for generating the digital output signal according to the first and the second level signals; and
    a control unit coupled to the pulse generator, for outputting the first and the second control voltages according to the digital output signal.

2. The apparatus of claim 1, wherein the pulse generator changes the voltage of the digital output signal when the pulse generator receives the first level signal; and the pulse generator restores the voltage of the digital output signal to a voltage value before receiving the first level signal to generate the digital output signal when the pulse generator receives the second level signal.

3. The apparatus of claim 2, wherein the pulse generator ignores next (N-1) second level signals when the pulse generator continuously receives N first level signals.

4. The apparatus of claim 1, wherein the control unit comprises:
    a delay circuit, for delaying the digital input signal to generate a delay signal; and
    a calculating unit, for generating the first and the second control voltages according to the delay signal and the digital output signal.

5. The apparatus of claim 4, wherein the sum of the first and the second control voltages is a predetermined constant.

6. The apparatus of claim 1, wherein the first trigger comprises:
    an integrator, for generating the first trigger signal, wherein the integrator is reset when the integrator receives a reset signal;
    a comparator coupled to the integrator, for comparing the first trigger signal with the first control voltage; and
    a reset circuit coupled to the integrator and the comparator, for generating the reset signal according to a comparison result of the comparator.

7. The apparatus of claim 6, wherein the control unit further comprises:
    a delay circuit, for delaying the digital input signal to generate a delay signal; and
    a calculating unit, for generating the first and the second control voltages according to the delay signal and the digital output signal.

8. The apparatus of claim 7, wherein the sum of the first and the second control voltages is a predetermined constant.

9. The apparatus of claim 1, wherein the control unit generates the first and the second control voltages according to the digital input signal and the digital output signal.

10. The apparatus of claim 1, wherein the digital input signal and the digital output signal are pulse-width-modulation signals.

11. A method of processing a digital input signal to generate a digital output signal, the method comprising:
    generating a first trigger signal according to a rising edge of the digital input signal;
    generating a first level signal according to the first trigger signal and a first control voltage;
    generating a second trigger signal according to a falling edge of the digital input signal;
    generating a second level signal according to the second trigger signal and a second control voltage;
    generating the digital output signal corresponding to the digital input signal in accordance with the first and the second level signals; and
    generating the first and the second control voltages according to the digital input signal and the digital output signal.

12. The method of claim 11, wherein the step of generating the digital output signal further comprises:
    changing the voltage of the digital output signal while receiving the first level signal; and
    restoring the voltage of the digital output signal while receiving the second level signal.

13. The method of claim 12, wherein if N first level signals are received continuously, then the next (N-1) second level signals are ignored.

14. The method of claim 11, wherein the sum of the first and the second control voltages is a predetermined constant.

15. The method of claim 11, the step of generating the first and the second control voltages further comprising:

delaying the digital input signal to generate a delay signal; and setting the first and the second control voltages according to the delay signal and the digital output signal.

16. The method of claim 15, wherein the sum of the first and the second control voltages is a predetermined constant.

17. The method of claim 11, wherein the digital input signal and the digital output signal are pulse-width-modulation signals.

18. A method of processing a digital input signal to generate a digital output signal, the method comprising:

generating a first trigger signal according to a rising edge of the digital input signal;

generating a first level signal according to the first trigger signal and a first control voltage;

generating a second trigger signal according to a falling edge of the digital input signal;

generating a second level signal according to the second trigger signal and a second control voltage; and generating the digital output signal corresponding to the digital input signal in accordance with the first and the second level signals;

wherein the step of generating the digital output signal farther comprises:

changing the voltage of the digital output signal while receiving the first level signal; and restoring the voltage of the digital output signal while receiving the second level signal.

19. The method of claim 18, wherein if N first level signals are received continuously, then the next (N-1) second level signals are ignored.

20. The method of claim 18, wherein the sum of the first and the second control voltages is a predetermined constant.

* * * * *